United States Patent [19]
Reitinger

[11] Patent Number: 5,220,277
[45] Date of Patent: Jun. 15, 1993

[54] ARRANGEMENT FOR TESTING SEMICONDUCTOR WAFERS OR THE LIKE

[76] Inventor: Erich Reitinger, Industriestr. 6, Germering, Fed. Rep. of Germany, D-8034

[21] Appl. No.: 856,256

[22] Filed: Mar. 25, 1992

[30] Foreign Application Priority Data

Mar. 26, 1991 [DE] Fed. Rep. of Germany ....... 4109908

[51] Int. Cl.⁵ .................... G01R 1/06; G01R 31/02
[52] U.S. Cl. .................... 324/158 F; 324/158 P; 361/381
[58] Field of Search ............ 324/158 F, 158 P, 158 R, 324/72.5; 361/385, 386, 384, 381; 165/80.4, 80.5; 379/50, 57

[56] References Cited

U.S. PATENT DOCUMENTS

| | | | |
|---|---|---|---|
| 3,710,251 | 1/1973 | Hagge et al. ..................... | 324/158 F |
| 4,665,360 | 5/1987 | Phillips ............................... | 324/158 |
| 4,757,255 | 7/1988 | Margozzi ........................... | 324/158 F |
| 4,968,931 | 11/1990 | Littlebury et al. ............... | 324/158 F |
| 5,010,296 | 4/1991 | Okada et al. ..................... | 324/158 F |
| 5,034,688 | 7/1991 | Moulene et al. ................. | 324/158 F |
| 5,084,671 | 1/1992 | Miyata et al. .................... | 324/158 F |

FOREIGN PATENT DOCUMENTS 2753684 6/1979 Fed. Rep. of Germany .
255410 3/1988 Fed. Rep. of Germany .

*Primary Examiner*—Vinh Nguyen
*Attorney, Agent, or Firm*—Weingarten, Schurgin, Gagnebin & Hayes

[57] ABSTRACT

An apparatus for testing semiconductor wafers and the like includes a prober table for receiving the semiconductor wafers to be tested and a holder receiver for receiving holders for probes or test needles. The prober table is arranged within a container having an open upper portion that has a plate having an opening through which pass the probes or test needles into the container. Discharge elements are provided within the container that are connected via a connection to a source for air, gas or the like.

15 Claims, 2 Drawing Sheets

ARRANGEMENT FOR TESTING SEMICONDUCTOR WAFERS OR THE LIKE

The invention relates to an arrangement for testing semiconductor wafers or the like according to the preamble of claim 1.

The testing of semiconductor wafers is carried out in temperature ranges from −200° C. to +400° C. These temperature values are obtained by cooling and/or heating a prober table on which the semiconductor wafers are placed for test purposes. In the range around and beneath 0° C., on the wafers and on the prober tables themselves ice crystals are formed which result from the humidity of the ambient air. To avoid such ice crystals, in manually operable probers a nitrogen jet is directed onto the prober. Although with this method in the core region of the nitrogen jet the production of ice crystals is avoided, an ice crystal formation due to the sucking in of the ambient air at the edge regions of the nitrogen jet is not prevented on the semiconductor wafers.

The invention is based on the problem of forming an arrangement of the type mentioned at the beginning in such a manner that when operating at temperatures around and beneath 0° C. the production of ice crystals is prevented and that in operation above 0° C. disturbances due to dust and/or oxidation can be avoided.

This problem is solved according to the invention in that the upwardly open container is covered by a plate which comprises an opening for the passage of probes and that within the container discharge elements are provided which are connected via a connection to a source for air, gas or the like.

The invention provides an arrangement for testing semiconductor wafers with which on cooling by the prober table to temperatures around or below 0° C. the generation of ice crystals is prevented, and furthermore at temperatures above 0° C. clean room conditions can be maintained and for specific purposes oxidation phenomena at the tips of the probes can be avoided.

In the arrangement according to the invention the prober table is disposed within an upwardly open container, the prober table being movable either together with the container or relatively to the latter in a horizontal plane. The upwardly open container is closed by a plate with an opening, the prober table thereby being arranged within a space defined by the container and the plate. Probes contact the semiconductor wafers to be tested through the plate opening. To avoid the formation of ice crystals and/or penetration of dust particles, via discharge elements lying within the container a gas or air with the necessary temperature and/or the desired dew point is conducted into the container. The flow velocity is chosen so that a laminar flow is ensured and a predetermined amount of air emerging from the plate opening obtained.

According to a preferred embodiment of the arrangement according to the invention the discharge elements consist of porous bodies, for example in the form of cylindrical tubes, the porosity of which is chosen so that the gas or the air emerges uniformly over the entire length of the discharge elements into the interior of the container and turbulences within the container are thereby avoided.

Hereinafter a preferred embodiment of the arrangement according to the invention will be described with the aid of the drawing to explain further features. In the drawings.

Figure 1:
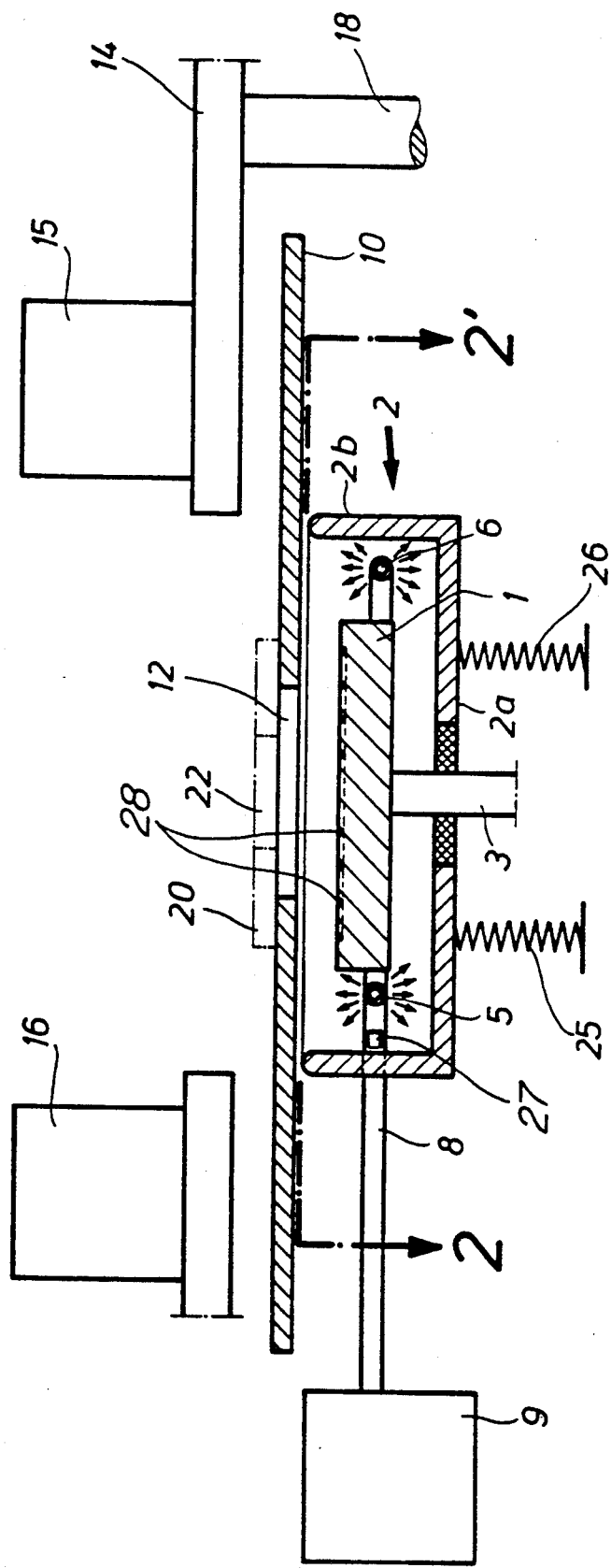
FIG. 1 shows a schematic partially sectioned view of the arrangement.

FIG. 1 shows in schematic illustration an arrangement for testing semiconductor wafers, hybrid circuits or the like, comprising a prober table 1 which serves to receive semiconductor wafers and is formed in known manner at its surface with narrow preferably circular extending grooves which via a connection system, not shown, serve to exert a partial vacuum with respect to the deposited semiconductor wafer and hold said semiconductor wafer on the prober table 1. The prober table 1 is further equipped with elements for heating and/or cooling. Such a prober table 1 can be moved both in the horizontal plane, i.e. in the X and Y direction, and in a vertical direction. According to the embodiment of the arrangement illustrated, on the mounting 3 of the prober table 1 an upwardly open container 2 is secured which according to this embodiment is movable together with the prober table 1 and consists of a bottom 2a and four side walls 2b. The side walls 2b have a height such that the prober table 1 comes to lie within said container 2 and the surface of the prober table 1 comes to lie beneath the upper edges of the side walls 2b. Between the mounting of the prober table 1 denoted by 3 and the bottom 2a a suitable seal is arranged which is not shown in the Figure and prevents any escape of the gas or air disposed in the container 2 downwardly.

Figure 2:
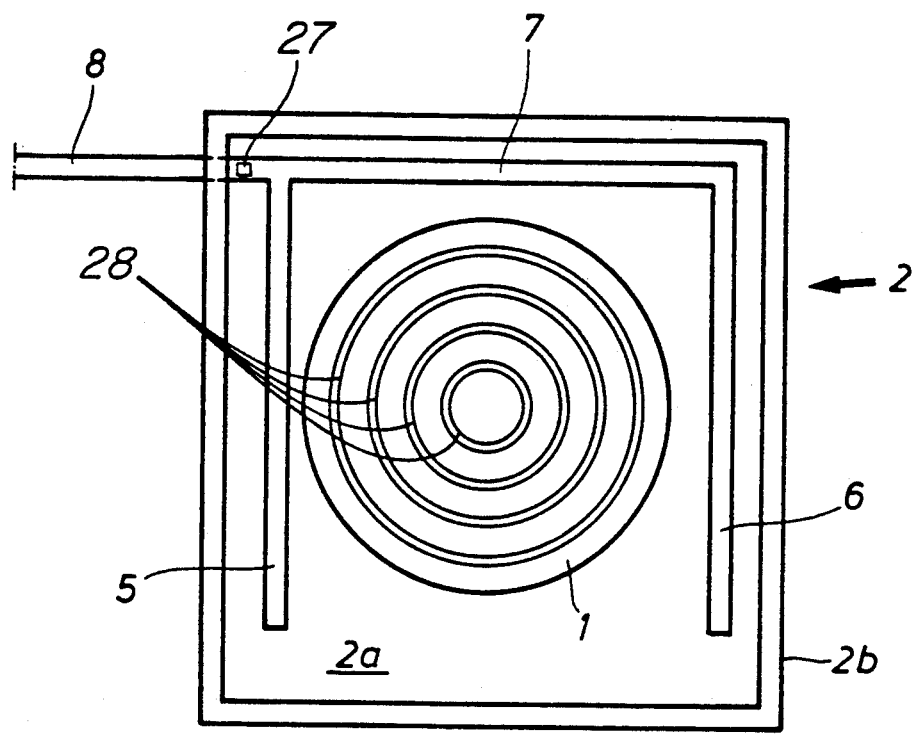
FIG. 2 shows a schematic partial plan view of the arrangement along the line 2-2' of FIG. 1.

Laterally of the prober table 1 discharge elements 5, 6 are provided for example in parallel array and via a connecting portion 7 (FIG. 2) communicate with each other and via a connection 8 are connected to a source 9. The source 9 generates the gas which is conducted into the interior of the container 2 for generating a laminar flow. As shown in FIG. 2 the connection 8 is led through one of the side walls 2b in such a manner that the connection 8 is sealed with respect to the side wall 2b concerned for avoiding any escape of air or gas. The discharge elements 5, 6 can be fixed with respect to the bottom 2a or the side walls 2b of the container 2 by holding clips or the like.

The upper side of the upwardly open container 2 is covered by a plate 10 which has a central opening 12 which preferably has a circular shape and is aligned centrally with respect to the centre of the likewise circular prober table 1. The plate 10, for example of sheet metal, is fixed with respect to the entire arrangement so that according to this embodiment the prober table 1 is movable together with the container 2 in the horizontal direction with respect to the plate 10 and a probe holding means 14.

The probe holding means 14 as well as the prober table 1 with its mounting 3 are mounted with respect to a frame, not illustrated, the probe holding means 14 being mounted, possibly movably, by a plurality of column guides with respect to the frame 1. The column guides of the probe holding means 14 are denoted in FIG. 1 by 18. On the probe holding means 14 a plurality of probe holders 15, 16 are mounted which in turn receive the probes to be used, not shown in FIG. 1.

The opening 12 of the plate 10 is configured in such a manner that the probes held by the probe holders 15, 16 permit a point contact to the semiconductor wafers to be tested. If required, the opening 12 can be closed by a ring 20, for example of plexiglass, comprising a likewise preferably circular opening 22 which is smaller than the opening 12. The ring 20 has an outer diameter slightly greater than the diameter of the opening 12.

By means of the ring 20, which either lies on the plate 10 or is inserted into an annular groove of the plate 10 in the region of the opening 12 thereof, formed laterally of the opening 12, a reduction of the cross-section of the opening 12 is achieved when required.

In the embodiment shown in FIGS. 1 and 2 a movement of the prober table 1 with respect to the probe holding means 14 and the probes clamped in the probe holders 15, 16 is possible to implement an incremental scanning of the semiconductor wafers lying on the prober table. According to the embodiment illustrated, the prober table 1 is moved together with the container 2 in the X and Y direction to permit the testing of the individual semiconductor wafers arranged on a carrier layer.

By the discharge elements 5, 6 a flow is generated within the container 2 which emerges uniformly from the discharge elements 5, 6 and generates a non-turbulent air flow within the container 2. As a result, a weak air flow or gas flow is generated in the direction of the opening 12 and said air or gas flow emerges uniformly from the opening 12. Consequently, the entrance of ambient air or particles from the environment into the interior of the container 2 is prevented.

The discharge elements 5, 6 are preferably cylindrical tubes, for example of ceramic, plastic or synthetic fibre, having a pore density of the order of magnitude of 1 to 30 $\mu$m. According to FIG. 2 these tubular discharge elements 5, 6 are sealed at the side with their free end, thereby ensuring the discharge of air or gas substantially in the radial direction with respect to the discharge elements 5, 6. Investigations have shown that with an arrangement having the structure described above a constant air volume emission from the opening 12 is always obtained, the air being cooled only slightly after it has passed the surface of the semiconductor wafer to be tested. Beneath the prober table 1 a cooling effect also caused by the prober table 1 can be observed; however, the temperature compared with the dried air supplied through the discharge elements 5, 6 with a surface temperature of the prober table 1 of about $-55°$ C. is only relatively lower than the air temperature of for example 20° C. supplied through the discharge elements 5, 6. Consequently, in the arrangement described the cooling effect of the prober table 1 is restricted in advantageous manner only to the semiconductor wafer to be tested whilst other parts within the space of the container 2 are not influenced by the cooling of the prober table 1.

The partial vacuum generated by the prober table 1 for holding the semiconductor wafers is negligible compared with the air volume supplied by the discharge elements 5, 6 and does not impair the laminar air flow desired within the container 2.

The cooling due to the prober table 1 is thus concentrated in the arrangement described on the semiconductor wafers deposited thereon and the remaining structure remains substantially at the temperature which corresponds to the temperature of the air supplied through the discharge elements 5, 6.

The arrangement according to the invention can also be used to maintain clean room conditions, i.e. for testing semiconductor wafers at temperatures above 0° C., for example at room temperature. When used in this manner air with the particular desired particle purity is introduced into the container 2 and dirt particles are prevented from entering the container 2 from above through the opening 12. When using the arrangement described under clean room conditions it is not absolutely essential to use pure air but filtered air can be supplied instead.

A further use of the arrangements described resides in the testing of semiconductor wafers at relatively high temperatures. At relatively high temperatures oxidations can occur at the needle tips. When using the arrangement according to the invention this can however be prevented in that through the discharge elements 5, 6 an inert gas (for example argon or nitrogen) is conducted into the interior of the container 2 and thereby the test tips of the probes held by the holders 15, 16 are always in a stream of inert gas, thus preventing oxidations which lead to erroneous measurements.

If the arrangement according to the invention is used in conjunction with dried air, the dew point of which is for example $-60°$ C., it may be necessary to provide in the container 2 an ionization means 27 in order to ionize the air led to the discharge elements 5, 6 before the entry thereof into the container 2. The purpose of ionizing the air is to avoid a spark flashover within the container 2 during the testing of the semiconductor wafers.

According to a further embodiment of the arrangement of the invention not illustrated in the drawings the prober table 1 is adjustable relatively to the container 2, in particular in the X-Y direction. To achieve this the bottom 2 is provided with a correspondingly large opening and within the opening of the bottom 2a round the mounting 3 a flexible seal is inserted to implement the adjustment of the mounting 3 relatively to the bottom 2a.

To hold the container 2 against the lower surface of the plate 10, in the embodiment shown in FIG. 1 spring means 25, 26 are provided which generate a biasing force and press the upper edges of the container walls 2b against the lower surface of the plate 10.

To obtain a jerk-free displacement of the container 2 with respect to the plate 10, i.e. to reduce substantially the frictional resistance between the upper edges of the side walls 2b and the plate 10, in a preferred embodiment the upwardly directed edges of the side walls 2b are rounded. Instead of the roundings of the edges of the side walls 2b additional slide elements may be provided, for example the edges of slide pins inserted from above.

To improve inspection of the container 2, the latter preferably consists of plexiglass.

FIG. 2 shows only one possible embodiment of the discharge elements 5, 6 which are arranged horizontally substantially parallel to each other and by a connecting tube 7 result in a substantially U-shaped or annular structure. Instead of the connecting tube 7 a corresponding discharge element may be provided which is connected to the other discharge elements 5, 6.

The arrangement according to the invention may be employed in the following manner:

In test operations in temperature ranges from $-200°$ C. to $+400°$ C. generated by elements 28 in the prober table 1 at its surface opposite the semiconductor wafers lying thereon, to avoid ice crystal formation an air flow is generated by the source 9 and has for example, a temperature of 20° C. and a dew point of up to $-196°$.

In the arrangement according to the invention, which is particularly suitable for manually operable probers, the trough-shaped container 2 may be displaced in the horizontal plane to such an extent that by shifting with respect to the plate 10 lying at the top in the manner of a drawer function it permits access to the prober table 1 to enable the semiconductor wafers to be exchanged.

In the testing of wafers probes in the form of test needles and/or needle edges may be used to contact the wafers, hybrid circuits or the like.

I claim:

1. An apparatus for testing semiconductor wafers or hybrid circuits, comprising:
    a prober table for receiving the semiconductor wafers or hybrid circuits to be tested;
    a holding means for receiving holders for probes or test needles;
    a container having an open upper portion and having said prober table arranged therein;
    a plate covering said container open upper portion, said plate having an opening for passage of probes or test needles into said container; and
    discharge elements including tubes of a porus material located within said container, said discharge elements connected by a connection to a source for supplying air or gas to said container through said tubes, said tubes positioned to provide a laminar flow of air or gas from said tubes in the direction of said plate opening and said laminar flow emerging uniformly from said plate opening.

2. The apparatus according to claim 1, wherein said container is fixedly connected to said prober table.

3. The apparatus according to claim 1, wherein said prober table is movable within said container.

4. The apparatus according to claim 1, wherein said source to which said discharge elements are connected generates air or gas at about 20° C. with a dew point up to −196° C.

5. The apparatus according to claim 1, wherein said source connected to said discharge elements is a source of filtered air of gas.

6. The apparatus according to claim 1, wherein said source connected to said discharge elements is a source for inert gas.

7. The apparatus according to claim 1, including means for ionizing said air or gas flow.

8. An apparatus for testing products such as semiconductor wafers or hybrid circuits, comprising:
    a prober table for receiving said products to be tested, said table including elements for heating and/or cooling said products to be tested;
    a container including an open upper portion, said container having said prober table arranged therein;
    a holding means for receiving holders for probes;
    a plate covering said container open upper portion, said plate having an opening for passage of probes therethrough; and
    discharge elements within said container which are connected by a connection to a source for supplying air or gas to said container through said discharge elements, said discharge elements including tubes of a porous material, said tubes positioned to provide a laminar flow of air or gas in the direction of said plate opening, said laminar flow of gas or air emerging uniformly from said plate opening to prevent formation of ice crystals and penetration of dust particles within said container.

9. The apparatus according to claim 8, wherein said container is fixedly connected to said table.

10. The apparatus according to claim 8, wherein said table is movable within said container.

11. The apparatus according to claim 8, wherein said source connected to said discharge elements provides air or gas with a temperature of about 20° C. with a dew point up to −196° C.

12. The apparatus according to claim 8, wherein said source connected to said discharge elements is a source of filtered air or gas.

13. The apparatus according to claim 8, wherein said source connected to said discharge elements is a source of inert gas.

14. The apparatus according to claim 8, including means for ionizing said air or gas.

15. An apparatus for testing products such as semiconductor wafers or hybrid circuits, comprising:
    a prober table for receiving said products to be tested, said table being equipped with elements for heating and/or cooling said products to be tested;
    a holding means for receiving holders for probes;
    a container having an open upper portion and containing said prober table, said container defined by a bottom wall and by side walls;
    a plate covering said open upper portion and having an opening for passage of probes into said container; and
    discharge elements within said container positioned laterally with respect to said prober table, said discharge elements connected via a connection to a source for supplying air or gas to said container through said discharge tubes, said discharge elements including tubes of a porous material, said tubes positioned to provide a laminar flow of air or gas in the direction of said plate opening, said laminar flow of gas or air emerging uniformly from said plate opening to prevent formation of ice crystals and penetration of dust particles within said container.

* * * * *

UNITED STATES PATENT AND TRADEMARK OFFICE
CERTIFICATE OF CORRECTION

PATENT NO. : 5,220,277
DATED : June 15, 1993
INVENTOR(S) : Erich Reitinger

It is certified that error appears in the above-identified patent and that said Letters Patent is hereby corrected as shown below:

Column 5, line 40, "air of gas" should read --air or gas--.

Signed and Sealed this

Twenty-first Day of June, 1994

Attest:

BRUCE LEHMAN

Attesting Officer      Commissioner of Patents and Trademarks